(12) United States Patent
Bhattaru et al.

(10) Patent No.: US 11,804,805 B2
(45) Date of Patent: Oct. 31, 2023

(54) HIGH-SPEED CURRENT-FEEDBACK AMPLIFIER WITH DISTORTION CANCELLATION

(71) Applicant: TEXAS INSTRUMENTS INCORPORATED, Dallas, TX (US)

(72) Inventors: Purnendu Bhattaru, Bangalore (IN); Sureshkumar Ramalingam, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 36 days.

(21) Appl. No.: 17/702,631

(22) Filed: Mar. 23, 2022

(65) Prior Publication Data

US 2023/0308057 A1  Sep. 28, 2023

(51) Int. Cl.
H03F 1/32 (2006.01)
H03F 3/04 (2006.01)
H03F 3/45 (2006.01)

(52) U.S. Cl.
CPC .................... *H03F 1/32* (2013.01); *H03F 3/04* (2013.01)

(58) Field of Classification Search
CPC .............. H03F 1/32; H03F 3/04; H03F 3/45
USPC .................... 330/291, 310, 255, 265, 267
See application file for complete search history.

(56) References Cited

U.S. PATENT DOCUMENTS

| 6,163,216 A * | 12/2000 | Murray ............... H03F 3/45609 330/257 |
| 6,294,958 B1 * | 9/2001 | Eschauzier ........... H03F 3/3066 330/268 |
| 8,310,307 B2 * | 11/2012 | Kawaguchi .......... H03F 3/4517 330/265 |

* cited by examiner

*Primary Examiner* — Hieu P Nguyen
(74) *Attorney, Agent, or Firm* — Valerie M. Davis; Frank D. Cimino

(57) ABSTRACT

Described examples include an integrated circuit having an input stage with an input and an output. A first current mirror is coupled to the output, the first current mirror including a first transistor having an emitter and a base coupled to the output of the input stage, and a collector coupled to a reference potential. The first current mirror also includes a second transistor having a base coupled to the base of the first transistor, an emitter coupled to the reference potential and a collector coupled to an output node. A buffer has an input coupled to the output node and an output. A third transistor has a base and an emitter coupled to the reference potential and a collector coupled to the output of the buffer. A second current mirror couples a portion of the buffer output current to the base of the first transistor.

20 Claims, 7 Drawing Sheets

HIGH-SPEED CURRENT-FEEDBACK AMPLIFIER WITH DISTORTION CANCELLATION

TECHNICAL FIELD

This application relates generally to amplifying circuits, and more particularly to current-feedback amplifiers.

BACKGROUND

Current-feedback amplifiers are used in high-speed, wideband applications. This type of amplifier provides a high slew-rate at the expense of some loss of direct current gain relative to other amplifier types. The input stage of a current-feedback amplifier is often a push-pull pair of transistors with the non-inverting input of the amplifier coupled to the bases of the push-pull pair and the inverting input coupled to the emitters of the push-pull pair. To provide high gain, the current through the push-pull pair is mirrored to a high impedance node using a transistor in series with each of the push-pull pair mirroring the current in the pull-up and pull-down sides of the circuit. However, when operated at high frequencies, the base-collector capacitance of the corresponding mirror transistors can introduce significant harmonic distortion. It is desirable to reduce this harmonic distortion.

SUMMARY

In accordance with an example, an integrated circuit includes a voltage input and a current output responsive to the voltage input, the integrated circuit having an input stage coupled to the voltage input. The integrated circuit also includes a first current mirror coupled to the input stage, the first current mirror includes a first transistor having a first current terminal, a second current terminal operable to be coupled to a first voltage supply, and a control terminal coupled to the input stage and the first current terminal. The integrated circuit also includes a second transistor having a control terminal coupled to the control terminal of the first transistor, a first current terminal operable to be coupled to the first voltage supply, and a second current terminal. The integrated circuit also includes a buffer having an input coupled to the second current terminal of the second transistor and having a buffer output and a third transistor having a control terminal and a first current terminal coupled to the first voltage supply and having a second current terminal coupled to the buffer output. Wherein the buffer is operable to output a current to offset a distortion current provided by the first current mirror output of the buffer and having an output coupled to the control terminal of the first transistor.

DETAILED DESCRIPTION

Figure 1:
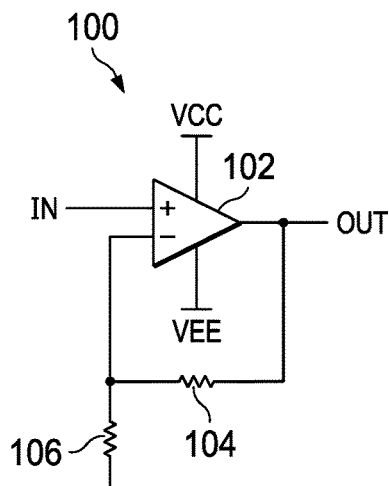
FIG. 1 is a schematic circuit diagram of an example circuit.

The same reference numbers or other reference designators are used in the drawings to designate the same or similar (structurally and/or functionally) features. The drawings are not necessarily drawn to scale.

FIG. 1 is a schematic circuit diagram of an example of a circuit 100 including a current-feedback amplifier (CFA) 102. Input IN is applied to the non-inverting input ("+" input—also referred to as "+IN") of CFA 102. A first resistor 104 couples the output of CFA 102 to the inverting input ("−" input—also referred to as "−IN") of CFA 102. A second resistor 106 couples the inverting input of CFA 102 to a reference potential (e.g., ground, VSS or VEE). Similar to a voltage-feedback amplifier (VFA) or op amp, first resistor 104 and second resistor 106 serve as a voltage divider between the output of CFA 102 and the reference potential or ground.

Under quiescent conditions, the voltages at +IN and −IN are equal. That is, the output of CFA 102 is at a voltage such that the voltage divider of first resistor 104 and second resistor 106 provides a voltage equal to the input on +IN. Thus, the amplification of circuit 100 is proportional to the ratio of the resistance of first resistor 104 over the resistance of second resistor 106. When the input on +IN changes, there is initially a difference between the voltage on +IN and −IN. This is known as the error. The output of CFA 102 will change until this error is again near zero. How fast this change occurs is known as the slew rate of the amplifier. CFAs have a very low input impedance that allows for a higher driving current on the −IN input when an error occurs, which in turn provides for a very high slew rate (fast output change for a given period of time). This enables the CFA to change its output very fast and thus to operate at higher frequencies than a comparable VFA.

Figure 2:
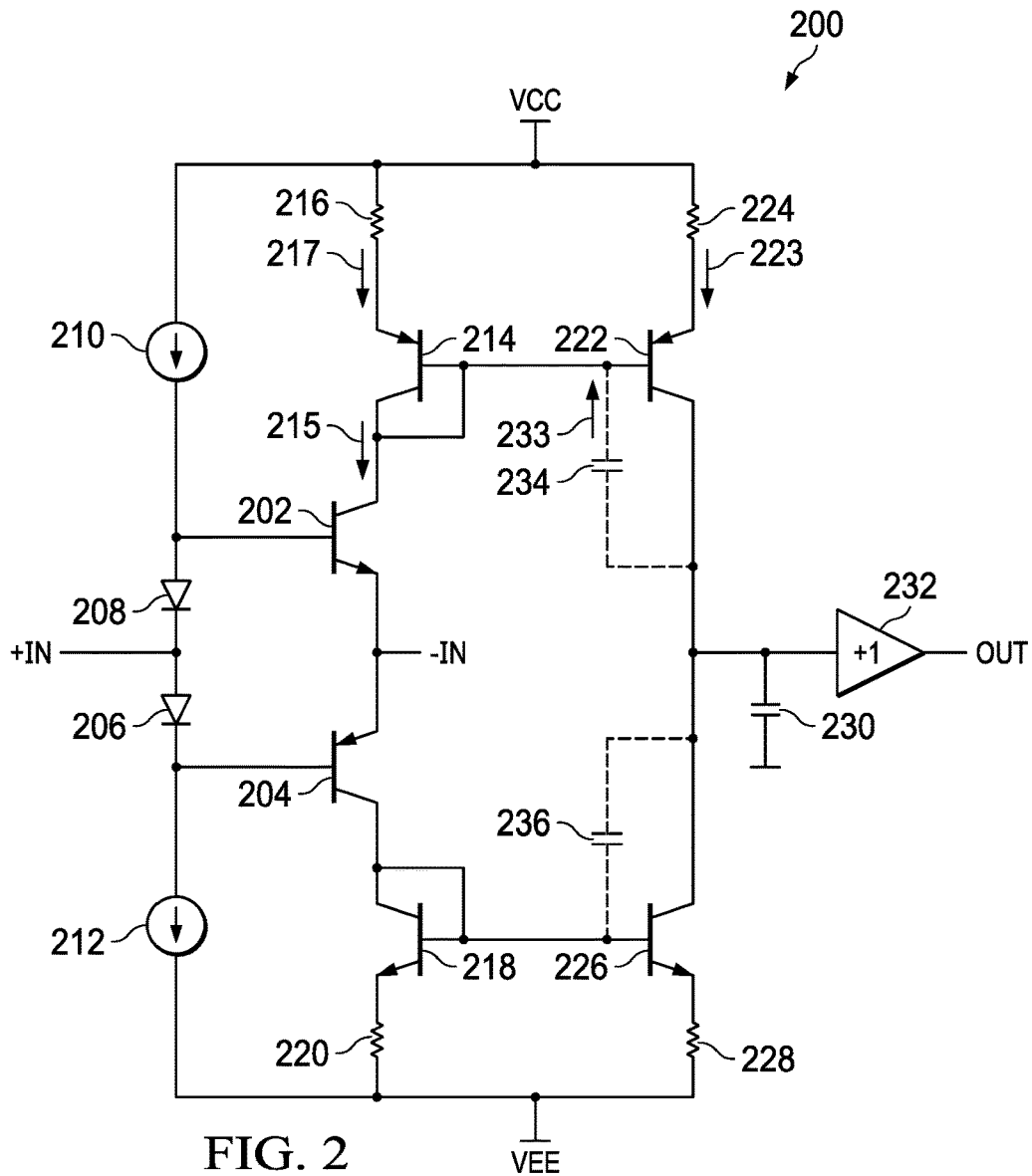
FIG. 2 is a schematic circuit diagram of an example current-feedback amplifier

FIG. 2 is a schematic circuit diagram of an example current-feedback amplifier 200, which may be an implementation of CFA 102. The non-inverting input +IN is connected to the bases of first transistor 202 and second transistor 204 via second diode 208 and first diode 206, respectively. First transistor 202 and second transistor 204 are the input stage of current-feedback amplifier 200. In this example, all of the transistors are bipolar transistors. For example, first transistor 202 is an NPN bipolar transistor and second transistor 204 is a PNP bipolar transistor. First current source 210 provides bias for second diode 208. Second current source 212 provides bias for first diode 206. Inverting input −IN is coupled to the emitter of first transistor 202. Inverting input −IN is also coupled to the emitter of second transistor 204. Coupling −IN to the emitters of first transistor 202 and second transistor 204 provides a low impedance input. The collector of first transistor 202 is coupled to first voltage VCC through first resistor 216 and third transistor 214. The collector of second transistor 204 is coupled to the second voltage VEE through second resistor 220 and fourth transistor 218. In this example, VCC is more positive than VEE. In an example, VCC is +10 volts and VEE is −10 volts. In other examples, VCC is 2.5 to 50 or more volts and VEE is −2.5 to −50 or more volts.

First current source 210 and second current source 212 forward bias first diode 206 and second diode 208. The forward bias drop of second diode 208 is approximately equal to the forward biased voltage drop between the base and emitter of first transistor 202. Therefore, if the voltage at input +IN is Vin, then the base of first transistor 202 is held at Vin plus one threshold voltage. Similarly, the voltage drop across first diode 206 is approximately equal to the base-emitter voltage drop of second transistor 204. When Vin and −−Vin (representing the voltage on input −IN) are zero volts, both first transistor 202 and second transistor 204 are "on" (i.e., conducting). Assuming that −−Vin is held at zero for simplicity of explanation, as Vin rises, first transistor 202 has a current proportional to Vin times the a gain of first transistor 202. In addition, the base of second transistor 204 rises, thus pulling the base-emitter voltage of second transistor 204 below its threshold and shutting "off" (i.e., causing to be non-conducting) second transistor 204. The reverse occurs when Vin goes below zero. In summary, when Vin is greater than −−Vin, the upper half of amplifier 200 is "on" (i.e., active). When Vin is lower than −−Vin, the lower half of amplifier 200 is "on." When Vin and −−Vin are equal, both first transistor 202 and second transistor 204 are "on." Therefore, amplifier 200 has a Class AB configuration.

When first transistor 202 is "on", the collector to emitter current 215 is:

$$I_C = \alpha^* V_{BE} = \alpha^* [(Vin + V_{diode\ 208}) - (-Vin)] \tag{1}$$

where $V_{diode\ 208}$ is the threshold voltage across diode 208. In some examples, Vin and −Vin are the same or substantially the same values.

For simplicity of explanation, −−Vin is assumed to be zero volts. The base of third transistor 214 is connected to its collector. Thus, the current through third transistor 214 and first resistor 216 is the same as the current through first transistor 202. Since, the base of fifth transistor 222 is coupled to the base of third transistor 214 and the emitter of fifth transistor 222 is coupled to VCC through third resistor 224, fifth transistor 222 mirrors the current in third transistor 214 by a factor of "n" that is dependent on the relative sizes (e.g., the proportional sizes of the devices doped regions) of third transistor 214 and fifth transistor 222. Thus, ideally, the current through fifth transistor 222 is provided by Equation (2):

$$I_{223} = n^* I_{215} = n[(\alpha^* Vin)] \tag{2}$$

Because Vin is greater than −Vin and thus sixth transistor 226 is "off," this mirrored current 223 is applied to the input impedance of output buffer 232 to produce the input voltage of output buffer 232, which is reflected as the same or a proportion of voltage at OUT. Capacitor 230 may be connected from the input of output buffer 232 to a common potential (e.g., ground or VEE) to dampen unwanted oscillation. Although, the input to output buffer 232 is shown in FIG. 2 as a single input, in other examples, like FIG. 3 discussed below, this coupling is more complex.

As noted above, Equation (2) is the ideal. However, the base-collector capacitance 234 (which is the base to collector capacitance of fifth transistor 222) introduces a significant source of distortion. Although a static scenario for the operation of amplifier 200 is discussed above. A static amplifier is not very useful. The reason current-feedback amplifiers are generally used is for high slew rate and thus high frequency operations. In operation, base-collector capacitance 234 provides an opposing $I_{NL}$ current 233 that subtracts from the current on the bases of third transistor 214 and fifth transistor 222 and causing the current through fourth transistor 214 to be:

$$I_{215} = \alpha^* Vin - I_{NL} \tag{3}$$

Thus, accounting for the current through base-collector capacitance 234, the current 223 applied to output buffer 232 is Equation (4):

$$I_{223} = n(\alpha^* Vin - I_{NL}) \tag{4}$$

The $I_{NL}$ current 233 can induce significant harmonic distortions. In addition, parasitic base-collector capacitance 236 causes similar effects on the operation of the lower portion of amplifier 200 (e.g., the portion driven by second transistor 204, which includes fourth transistor 218 and sixth transistor 226).

Figure 3:
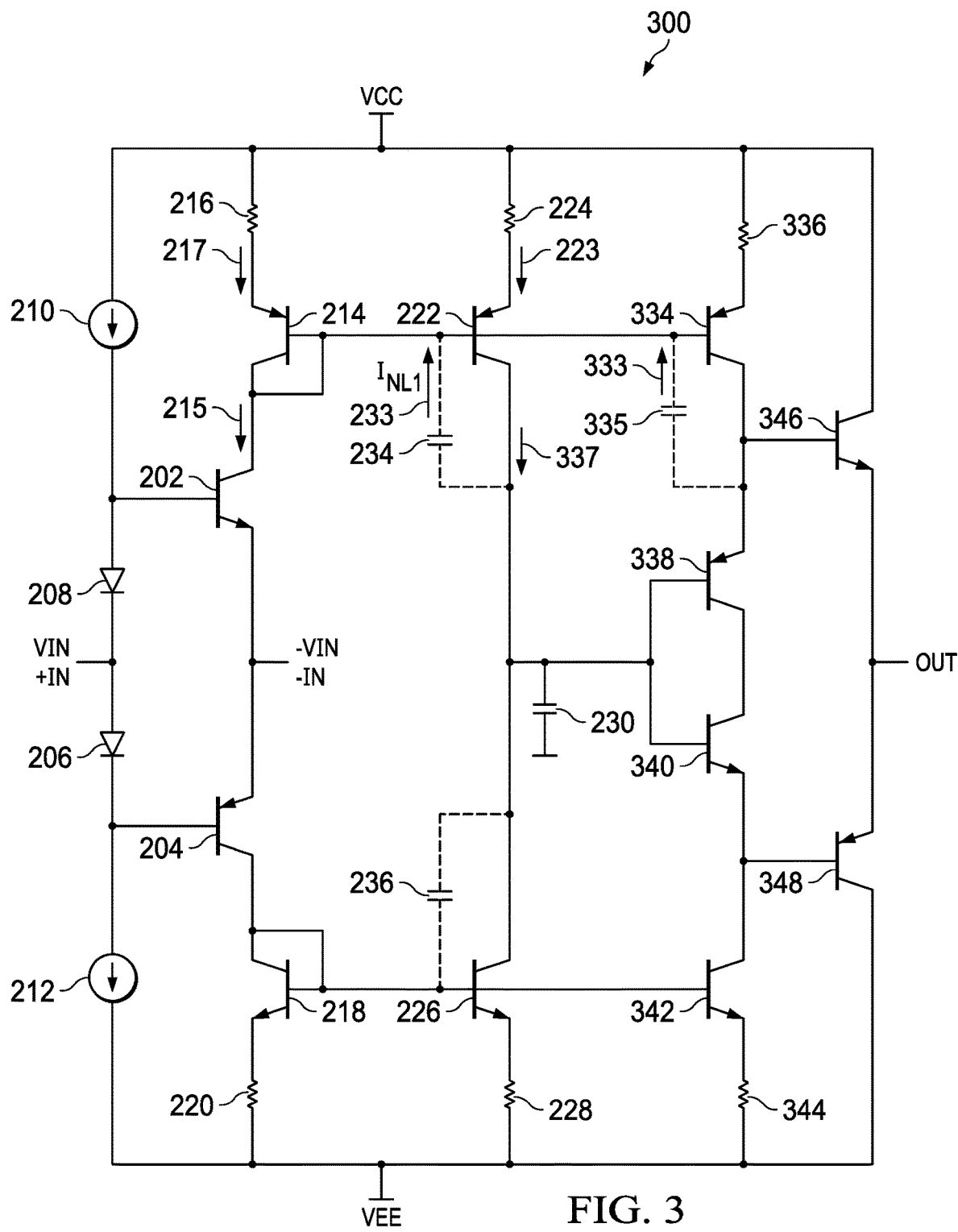
FIG. 3 is schematic circuit diagram of an example current-feedback amplifier.

FIG. 3 is a schematic circuit diagram of another example current-feedback amplifier 300. This example amplifier takes advantage of the current mirrors in amplifier 200 to provide a high impedance input node for the buffer (such as output buffer 232 (FIG. 2)). This high impedance input node, along with capacitor 230, properly damps ringing in amplifier 300 while providing strong base drive for the output stage. The following discussion addresses the operation of the pull-up side of amplifier 300. However, the same operational details apply to the pull-down side with the polarities reversed.

The bases of seventh transistor 338 and eighth transistor 340 are coupled to the collectors of fifth transistor 222 and sixth transistor 226, respectively. Fourth resistor 228 couples the emitter of sixth transistor 226 to VEE. The base of ninth transistor 334 is coupled to the base of third transistor 214 and the base of transistor 222, and the emitter of ninth transistor 334 is coupled to VCC through fifth resistor 336. Thus, the current through ninth transistor 334 mirrors (e.g., based on the proportional sizes of the doped regions of third transistor 214 and ninth transistor 334) the current through third transistor 214. The collector of ninth transistor 334 is coupled to the emitter of seventh transistor 338 and the base of pull-up output transistor 346. The collector of pull-up output transistor 346 is coupled to VCC and the emitter of pull-up output transistor 346 is coupled to output OUT. The base of tenth transistor 342 is coupled to the base of fourth transistor 218 and the base of transistor 226, and the emitter of tenth transistor 342 is coupled to VEE through sixth resistor 344. Thus, the current through tenth transistor 342 mirrors (e.g., based on the proportional sizes of the doped regions for fourth transistor 218 and tenth transistor 342) the current through fourth transistor 218. The collector of tenth transistor 342 is coupled to the emitter of eighth transistor 340 and the base of pull-down output transistor 348. The emitter of tenth transistor 342 is coupled to VEE through resistor 344. The collector of pull-down output transistor 348 is coupled to VEE and the emitter of pull-down output transistor 348 is coupled to output OUT.

As noted above, amplifier 300 operates similarly to amplifier 200 (FIG. 2) as a Class AB amplifier. When the value of Vin is greater than −Vin, the current flowing through transistor 202 determines the gain of first transistor 202 (assuming −−Vin is zero) times the base-to-emitter voltage of transistor 202 (see above). Due to the configuration of third transistor 214, fifth transistor 222, and ninth transistor 334, current through third transistor 214 is mirrored to fifth transistor 222 (and transistor 234) by a factor of "n" (where "n" is determined by the proportional sizes of doped regions of the transistors). The voltage on the base of seventh transistor 338 biases the base of pull-up output transistor 346 to one base-to-emitter voltage drop above the voltage on the base of seventh transistor 338. The voltage from the base of output pull-up transistor 346 to output terminal OUT is one base-to-emitter voltage lower. Therefore, the output voltage on output terminal OUT is the same as the voltage as the input to the buffer section of amplifier 300 (see output buffer 232 (FIG. 2)). When the pull-up portion of amplifier 300 is active, ninth transistor 334 provides current to bias pull-up output transistor 346 "on." Similarly, the voltage at the base of eighth transistor 340 biases the base of pull-down output transistor 348 to one base-to-emitter voltage drop below the voltage at the base of eighth transistor 340. The voltage from the base of output pull-down transistor 348 to output terminal OUT is one base-to-emitter voltage higher. When the pull-down portion of amplifier 400 is active, tenth transistor 342 provides current to bias pull-down output transistor 348 "on." This configuration provides a strong output drive to provide ample current to support a high slew rate.

Since ninth transistor 334 and tenth transistor 342 are in a current mirror configuration like fifth transistor 222 and sixth transistor 226, respectively, the collector-base capacitances of ninth transistor 334 and tenth transistor 342 provide a distorting feedback $I_{NL2}$ current 333 to their respective current mirrors (e.g., similarly as distorting current feedback $I_{NL}$, discussed above with reference to FIG. 2). This provides an additional source of harmonic distortion in current 337. With the additional $I_{NL2}$ current 335, current 337 has the formula of Equation (5):

$$I_{337} = n(\alpha^* vin - I_{NL1}) - I_{NL2} \quad (5)$$

where $I_{NL1}$ is equivalent to $I_{NL}$ as shown in FIG. 2 and discussed above.

Figure 4:
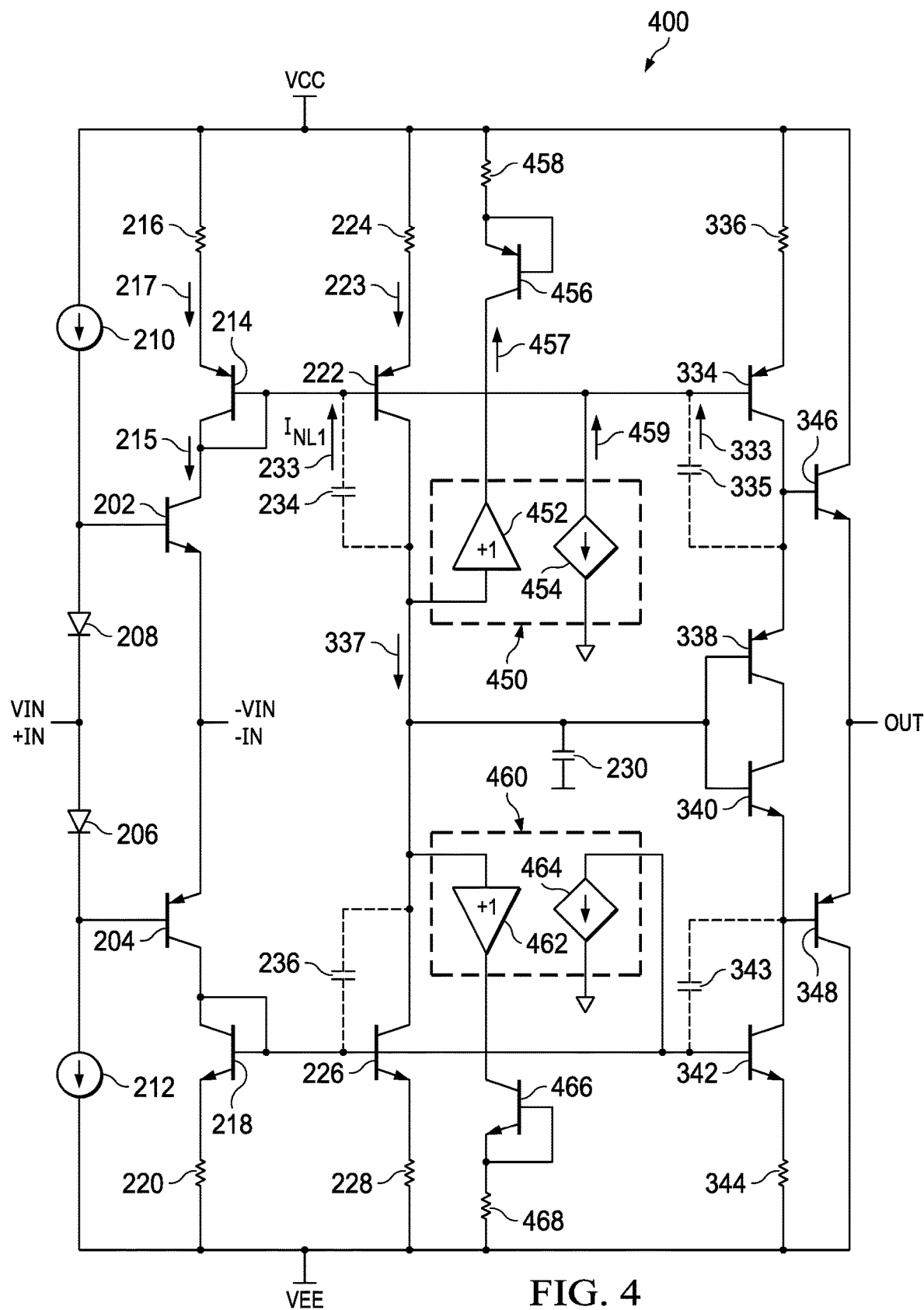
FIG. 4 is a schematic circuit diagram of another example current-feedback amplifier.

FIG. 4 is a schematic circuit diagram of another example current-feedback amplifier 400. Cancellation buffer 450 includes buffer 452 and current generator 454. The operation of these components is further explained below. The input of buffer 452 is coupled to the collector of fifth transistor 222. Thus, the input of buffer 452 is coupled to the same voltage that drives base-collector capacitance 234. The output of buffer 452 is coupled to the collector of eleventh transistor 456. The base of eleventh transistor 456 is coupled to the emitter of eleventh transistor 456, which is coupled to VCC through resistor 458. In this example, eleventh transistor 456 and resistor 458 are formed to be close in size and electrical characteristics to fifth transistor 222 and third resistor 224, respectively. In addition, in an example, these components are formed adjacent to each other so that any process, voltage or temperature variable affects these components equally. Thus, with its base and emitter coupled together, eleventh transistor 456 models the base-collector capacitance 234 of fifth transistor 222. Because the voltage applied to the collector of eleventh transistor 456 is the same as the voltage applied to the collector of fifth transistor 222, the current 457 through eleventh transistor is almost the same as the $I_{NL1}$ current 233 caused by the collector-base capacitance of fifth transistor 222. As further explained below with regard to FIG. 6, a proportion k of this current is mirrored to current source 454, which provides a current 459 that is opposite to $I_{NL}$ current 233 (e.g., the current flows in the opposite direction) to the bases of third transistor 214, fifth transistor 222 and ninth transistor 334, thus cancelling at least partially $I_{NL1}$ current 233. In a similar manner, cancellation buffer 460 (including buffer 462 and current source 464), twelfth transistor 466 and resistor 468 compensate for the distortion current caused by base-collector capacitance 236.

The base-collector capacitances of ninth transistor 334 and tenth transistor 342 (which are labelled base-collector capacitance 335 and base-collector capacitance 343, respectively) are additional sources of distortion. One technique to compensate for or mitigate these sources of distortion may include adjusting the size of transistor 456 and transistor 466 to provide additional current to compensate for both $I_{NL1}$ current 233 and $I_{NL2}$ current 333. However, this is an imperfect solution. For example, base-collector capacitance 234 and base-collector capacitance 335 are only partially in parallel. Therefore, these capacitances cannot simply be added together. In addition, a larger capacitance will have different frequency characteristics. Nonetheless, it may be possible through simulations and experimentation to determine a size for transistor 456 and transistor 466 that adequately compensates for both $I_{NL}$ current 233 and $I_{NL2}$ current 333.

Another technique to compensate for or mitigate the sources of distortion caused by base-collector capacitance 335 and base-collector capacitance 343 may involve adding two more cancellation buffers. At the price of additional complexity, a copy of cancellation buffer 450 along with a transistor configured like transistor 456 that has the characteristics of ninth transistor 334, and a resistor like resistor 458 that has the characteristics of fifth transistor 336 may be included to compensate for the $I_{NL2}$ current 333 through base-collector capacitance 335. A similar structure to compensate for the base-collector capacitance 343 can be added to the pull-down side with reversed polarities of components.

Figure 5:
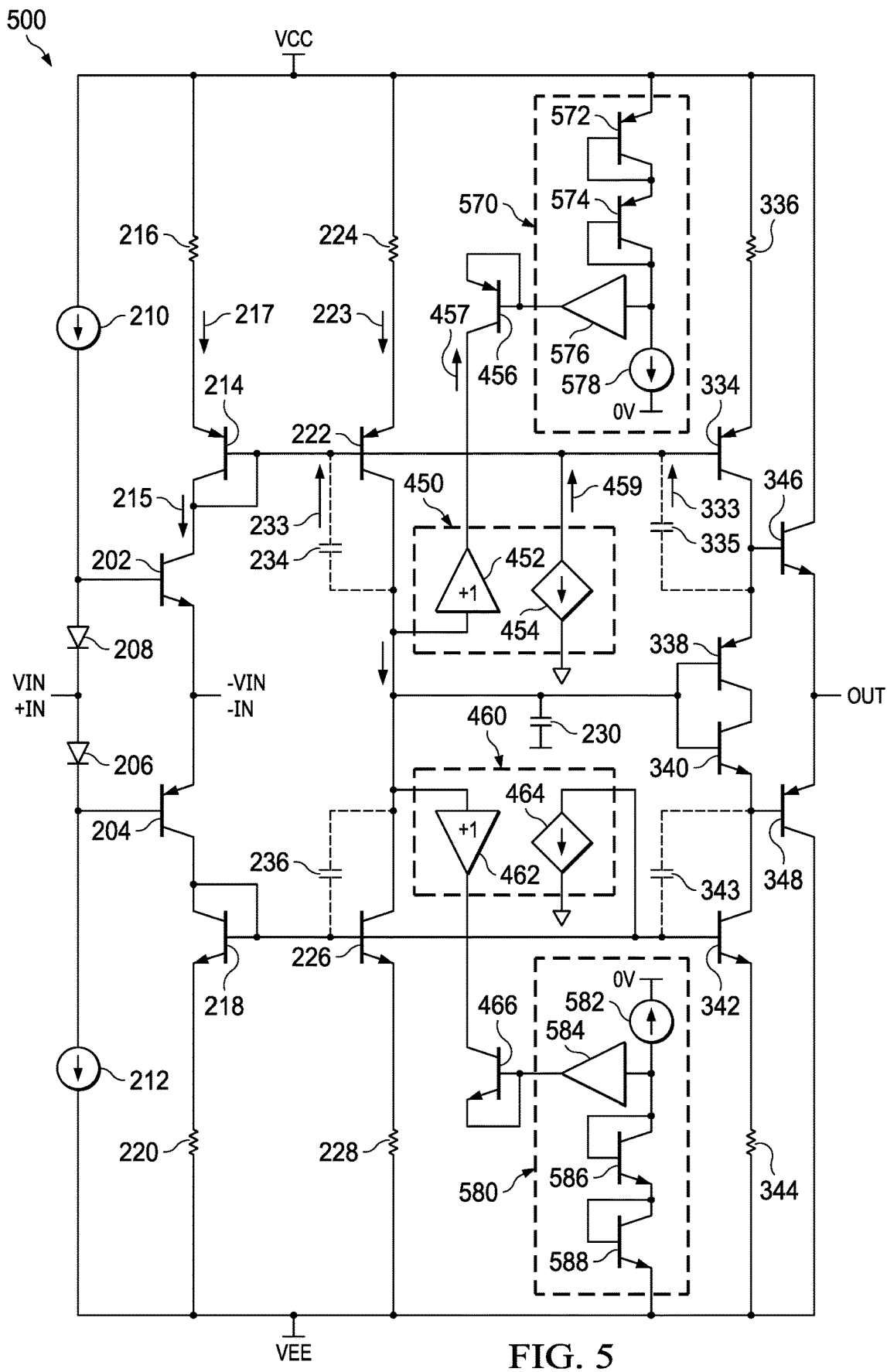
FIG. 5 is a schematic circuit diagram of another example amplifier.

FIG. 5 is a schematic circuit diagram of another example amplifier 500. In certain operational circumstances, the output of amplifier 500 may be very close to VCC or VEE. This is more common when VCC and VEE are lower voltages, for example when VCC is 2.5 volts and VEE is −2.5 volts. When Vin is "high", the current through first resistor 216 is "high" and thus the voltage drop across first resistor 216 is "high." The voltage at the base of third transistor 214 is [VCC−($V_{drop\ 216}$)−($V_{be}$)]. However, with this "high" Vin, the "high" current through fifth transistor 222 causes a "high" voltage at the input stage provided by seventh transistor 338 and eighth transistor 340. This causes a "high" voltage at the collector of fifth transistor 222 with a "low" voltage on the base of fifth transistor 222, which means the base-collector junction of fifth transistor 222 may be forward biased. Furthermore, the collector of ninth transistor 334 is one threshold voltage higher than the base of seventh transistor 338. Thus, the base-collector junction of ninth transistor 334 is even more forward biased. However, with the base of eleventh transistor 456 coupled through resistor 458 (FIG. 4) to VCC, the base-collector junction of eleventh transistor 456 will not be forward biased. In this circumstance, a resistor like resistor 458 (FIG. 4) will not allow eleventh transistor 456 to provide an accurate emulation of the base to collector capacitance of ninth transistor 334. To more accurately emulate the "forward biased" situation, transistor 456 is biased in amplifier 500 by first reference voltage generator 570 in amplifier 500. First reference voltage generator 570 includes first base-strapped transistor 572 and second base-strapped transistor 574, which are biased by third current source 578 which is coupled to ground (0 volts in this example) to provide two forward-biased voltage drops from VCC. This voltage is applied to the base and emitter of eleventh transistor 456 via third buffer 576. Thus, when the voltage on the collector of ninth transistor 334 is high enough to cause a forward biased or near forward biased base-collector condition on ninth transistor 334, eleventh transistor 456 will be in a similar state and provide a more accurate emulation of base to collector capacitance of ninth transistor 334. Similarly, second voltage reference 580, which includes third base-connected transistor 586, fourth base-connected transistor 588, fourth current source 582 and fourth buffer 584 bias the base of twelfth transistor 466. Thus, second voltage reference 580 operates like first reference voltage generator 570 with the polarities reversed so that twelfth transistor 466 has a forward biased base-collector junction when tenth transistor 342 and sixth transistor 226 have forward biased base-collector junctions.

Figure 6:
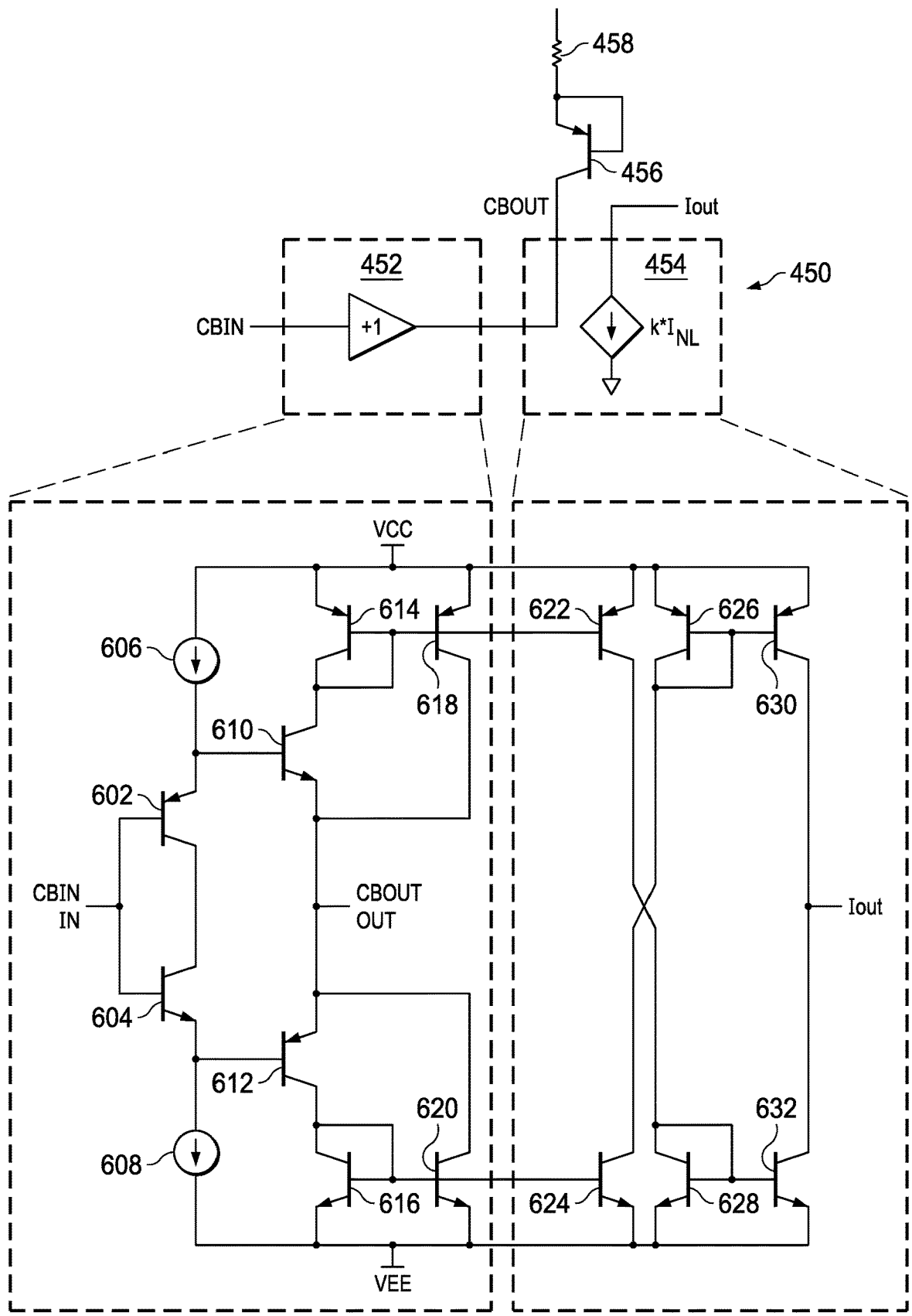
FIG. 6 is a schematic circuit diagram showing the details of an example cancellation buffer.

FIG. 6 is a schematic circuit diagram showing the details of an example cancellation buffer 450. Buffer 452, current generator 454, eleventh transistor 456 and resistor 458 are reproduced from FIG. 4 to show the interconnection of components. The input CBIN of buffer 452 is coupled to the base of first buffer transistor 602 and the base of second buffer transistor 604. First buffer current source 606 and second buffer current source 608 maintain forward bias of the base to emitter junction of first buffer transistor 602 and second buffer transistor 604, respectively. Therefore, the base of third buffer transistor 610 is held at one threshold voltage above CBIN, and the base of fourth buffer transistor 612 is held at one threshold voltage below CBIN. Thus, because the base third buffer transistor 610 is held one threshold above CBIN and the base of fourth buffer transistor is held one threshold below CBIN, the input stage of buffer 452 mimics the Class AB operation of amplifier 300 (FIG. 3). On the pull-up side of buffer 452, since fifth buffer transistor 614, seventh buffer transistor 618, and ninth buffer transistor 622 are configured as a current mirror, the current through fifth buffer transistor 614 (which is the same as the current through third buffer transistor 610) is mirrored by currents through seventh buffer transistor 618 and ninth buffer transistor 622. Similarly, on the pull-down side of buffer 452, the current through sixth buffer transistor 616 (which is the same as the current through fourth buffer transistor 612) is mirrored by the currents through eighth buffer transistor 620 and tenth buffer transistor 624. Seventh buffer transistor 618 and eighth buffer transistor 620 provide additional drive current and lower the output impedance of buffer 452 for fast operation. With the collector of eleventh transistor 456 coupled to buffer output terminal CBOUT and eleventh transistor 456 mimicking the base to collector capacitance of fifth transistor 222 and ninth transistor 334 (FIG. 4) by having a similar size on configuration as fifth transistor 222 as explained above in paragraph [0026], the current through fifth buffer transistor 614 and sixth buffer transistor 616 closely matches the $I_{NL}$ current because the voltage applied to eleventh transistor 456 is the same as the voltage applied to the base-collector capacitance 234 (FIG. 5). The current through ninth buffer transistor 622 is mirrored by twelfth buffer transistor 628 to fourteenth buffer transistor 632. When CBIN is high, the pull-down portion of buffer 456 (i.e., second buffer transistor 604, fourth buffer transistor 612, sixth buffer transistor 616, and eighth buffer transistor 620) are "off." This means that tenth buffer transistor 624, eleventh buffer transistor 626, and thirteenth buffer transistor 630 are also "off." Thus, the pull-up current through ninth buffer transistor 622 is converted to pull-down current on Iout. The current through tenth buffer transistor 624 is mirrored by eleventh buffer transistor 626 to thirteenth buffer transistor 630. When CBIN is low, the pull-up portion of buffer 456 (i.e., first buffer transistor 602, third buffer transistor 610, fifth buffer transistor 614, and seventh buffer transistor 618) are "off." This means that ninth buffer transistor 622, twelfth buffer transistor 628, and fourteenth buffer transistor 632 are also "off." Thus, the pull-down current through tenth buffer transistor 624 is converted to pull-up current on Iout. Of note, the mirror ratio from eleventh buffer transistor 626 to thirteenth buffer transistor 630, and the mirror ration from twelfth buffer transistor 628 to fourteenth buffer transistor 632 is a factor k that is less than one to avoid an oscillation caused by feedback through cancellation buffer 450. Thus, the $I_{NL}$ compensation current 459 applied to Iout closely matches $I_{NL1}$ current 233 and $I_{NL2}$ current 333 and cancels much of these distorting currents.

Figure 7:
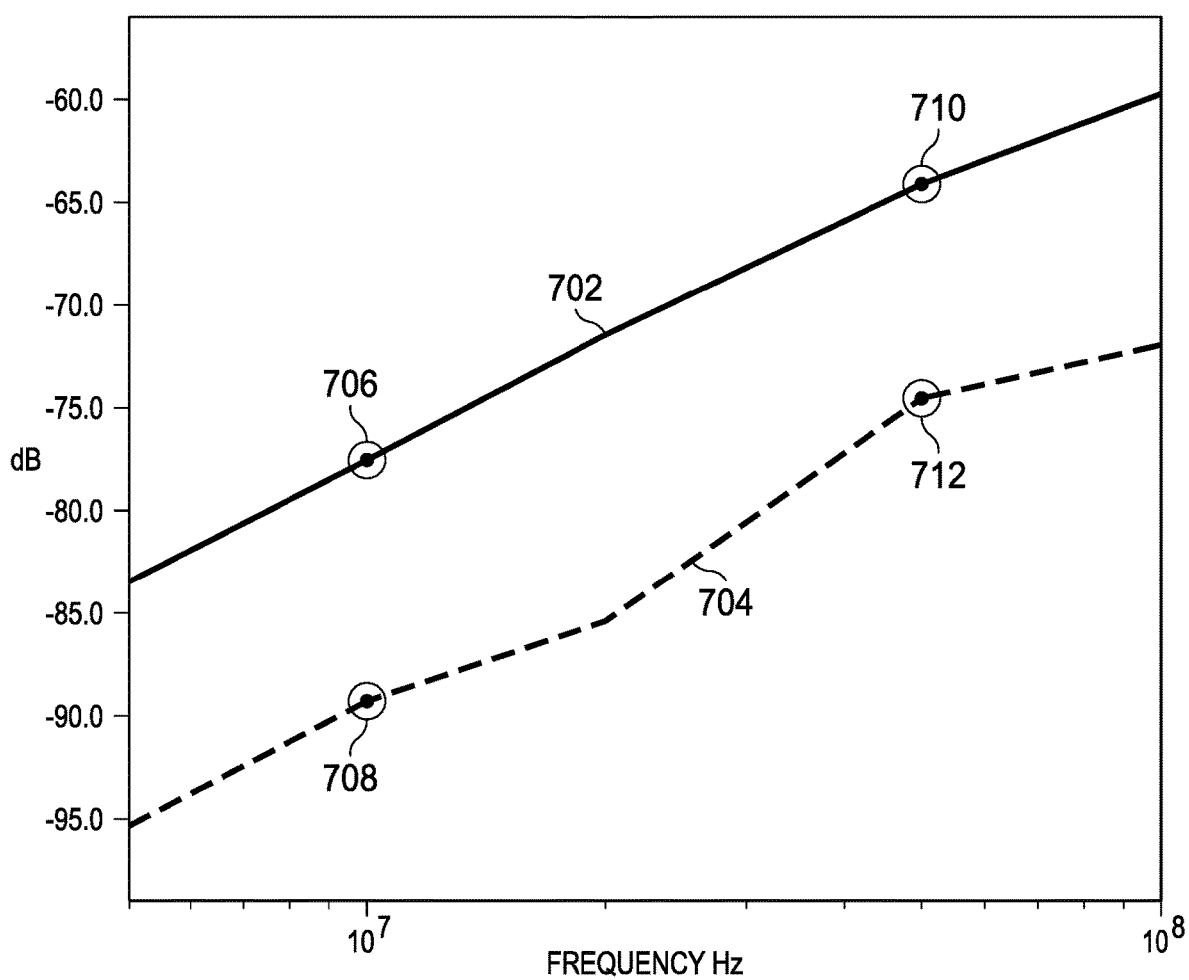
FIG. 7 is a graph comparing the harmonic distortion performance of an example amplifier compared to another example amplifier.

FIG. 7 is a graph 700 comparing the harmonic distortion performance of an example amplifier like amplifier 300 (FIG. 3) compared to another example amplifier like amplifier 400 (FIG. 4). Graph 700 is a graph of the second order harmonic distortion. The vertical axis of graph 700 is in decibels. For example, a data point at −80 decibels is 80 decibels below the primary signal (i.e., 0 decibels). The horizontal axis is signal frequency. Line 702 shows the performance of an amplifier like amplifier 300 (FIG. 3) that does not have cancellation buffers like cancellation buffer 450 and cancellation buffer 460 (FIG. 4). Line 704 shows the performance of an amplifier like amplifier 400 (FIG. 4) that does have cancellation buffers like cancellation buffer 450 and cancellation buffer 460 (FIG. 4). Point 706 is an example point where the input signal is at 10 MHz. Point 710 is an example point where the input signal is a 50 MHz. Point 708 is an example point where the input signal is at 10 MHz. Point 712 is an example point where the input signal is a 50 MHz. Graph 700 shows that the example amplifier like amplifier 400 (FIG. 4) improves the second order harmonic distortion by greater than 10 decibels over the example amplifier like amplifier 300 (FIG. 3) over the operating frequency range of the amplifiers.

Figure 8:
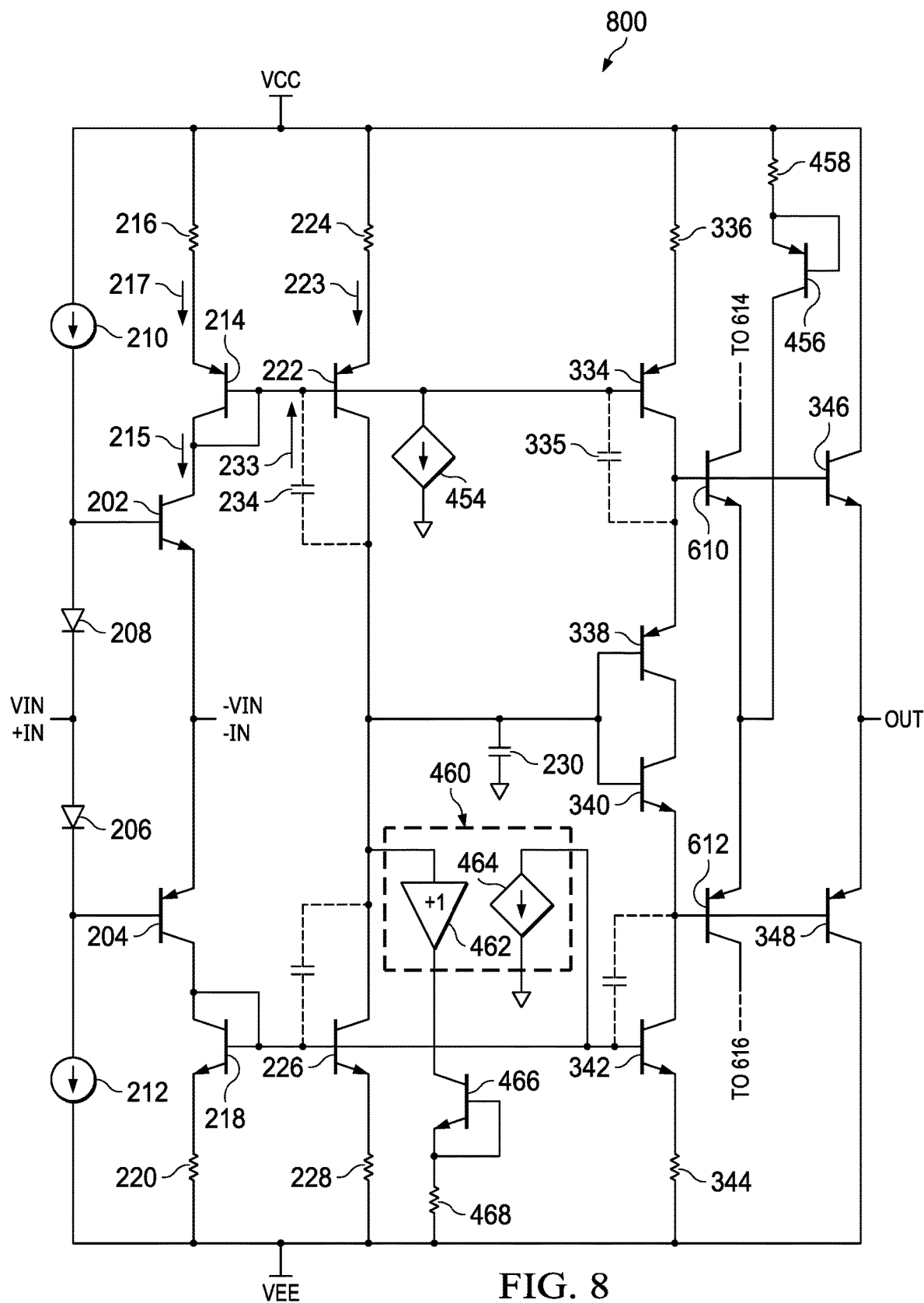
FIG. 8 is a schematic circuit diagram of another example amplifier.

FIG. 8 is a schematic circuit diagram of another example amplifier 800. Amplifier 800 is like amplifier 400 (FIG. 4) using cancellation buffer 450 and cancellation buffer 460 (FIG. 4) having the configuration shown in FIG. 6. However, cancellation buffer 450 and cancellation buffer 460 in FIG. 8 do not use the input stage using first buffer transistor 602, second buffer transistor 604, first buffer current source 606, and second buffer current source 608. Rather, the base of third buffer transistor 610 is coupled to the emitter of seventh transistor 338 and the base of fourth buffer transistor 612 is coupled to the emitter of eighth transistor 340. The rest of cancellation buffer 450 (which is not shown in FIG. 8 for clarity of the figure) is coupled to third buffer transistor 610 and fourth buffer transistor 612 as shown in FIG. 6. Corresponding transistors to third buffer transistor 610 and fourth buffer transistor 612 in cancellation buffer 460 for the pull-down portion of the circuit are coupled in a similar manner. Thus, the input stages in both cancellation buffer 450 and cancellation buffer 460 are eliminated. This significantly reduces power consumption, particularly at the voltages where the pull-up and pull-down portions of the circuit overlap and thus both input stage transistors are both partially conducting.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described examples, and other examples are possible, within the scope of the claims.

What is claimed is:

1. An integrated circuit having a voltage input and a current output responsive to the voltage input, the integrated circuit comprising:
   an input stage coupled to the voltage input;
   a first current mirror coupled to the input stage, the first current mirror including:
      a first transistor having:
         a first current terminal;
         a second current terminal operable to be coupled to a first voltage supply; and
         a control terminal coupled to the input stage and the first current terminal;
      a second transistor having:
         a control terminal coupled to the control terminal of the first transistor;
         a first current terminal operable to be coupled to the first voltage supply; and
         a second current terminal;
   a buffer having an input coupled to the second current terminal of the second transistor and having a buffer output;
   a third transistor having a control terminal and a first current terminal coupled to the first voltage supply and having a second current terminal coupled to the buffer output; and
   wherein the buffer is operable to output a current to offset a distortion current provided by the first current mirror.

2. The integrated circuit of claim 1, wherein the current is less than the distortion current.

3. The integrated circuit of claim 1, wherein the first transistor, the second transistor, and the third transistor are bipolar transistors.

4. The integrated circuit of claim 1 wherein the second transistor and the third transistor are proximate with each other.

5. The integrated circuit of claim 1, further comprising:
   a second current mirror coupled the input stage, the second current mirror including a fourth transistor having a first current terminal and a control terminal coupled to the input stage, and a second current terminal coupled to a reference potential, the third current mirror also including a fifth transistor having a control terminal coupled to the control terminal of the fourth transistor, a first current terminal coupled to the reference potential and a second current terminal coupled to a second current mirror output;

a second buffer having an input coupled to the second current mirror output and an output, wherein the buffer is configured to provide a voltage on the output proportional to the voltage on the input;

a sixth transistor having a control terminal and a first current terminal coupled to the reference potential and a second current handling terminal couple to the output of the second buffer; and a fourth current mirror having an input coupled to the output of the second buffer and having an output coupled to the control terminal of the fourth transistor.

6. The integrated circuit of claim 5, wherein the second current mirror is configured to mirror the current on the input of the second current mirror on the output of the second current mirror in a proportion less than one and the fourth current mirror is configured to mirror the current on the input of the fourth current mirror on the output of the fourth current mirror in a proportion less than one.

7. The integrated circuit of claim 5, wherein the first transistor, the second transistor, the third transistor, the fourth transistor, the fifth transistor, and the sixth transistor are bipolar transistors.

8. The integrated circuit of claim 5 wherein the second transistor and the third transistor are proximate with each other, and the fifth transistor and the sixth transistor are proximate with each other.

9. The integrated circuit of claim 1 further comprising an output buffer having an input coupled to the second current mirror output and an output.

10. The integrated circuit of claim 9 wherein the input of the output buffer has a high impedance.

11. An integrated circuit comprising:
a first transistor having a control terminal coupled to a first input node, a first current terminal coupled to a first input terminal and having a second current terminal;
a second transistor having a control terminal coupled to the first input node, a first current terminal coupled to the second input terminal and having a second current terminal;
a third transistor having a control terminal and a first current terminal coupled to the second current terminal of the first transistor, and the third transistor having a second current terminal coupled to a first reference potential;
a fourth transistor having a control terminal and a first current terminal coupled to the second current terminal of the second transistor, and the fourth transistor having a second current terminal coupled to a second reference potential;
a fifth transistor having a control terminal coupled to the control terminal of the third transistor, a first current terminal coupled to an output node and a second current terminal coupled to the first reference potential;
a sixth transistor having a control terminal coupled to the control terminal of the fourth transistor, a first current terminal coupled to the output node, and a second current terminal coupled to the second reference potential;
a buffer having an input coupled to the output node and having an output;
a seventh transistor having a first current terminal coupled to the output of the buffer, and having a control terminal and a second current terminal coupled to the first reference potential; and a current source coupled to the control terminal of the fifth transistor and operable to provide a current that is proportional to a current provided by the buffer through the seventh transistor.

12. The integrated circuit of claim 11, wherein the current source is a current mirror that mirrors the output current of the buffer.

13. The integrated circuit of claim 11, wherein the first transistor, the second transistor, the third transistor, the fourth transistor, the fifth transistor, the sixth transistor, and the seventh transistor are bipolar transistors.

14. The integrated circuit of claim 11, wherein the first transistor, the fourth transistor, and the sixth transistor are NPN bipolar transistors.

15. The integrated circuit of claim 11, wherein the second transistor, the third transistor, the fifth transistor, and the seventh transistor are PNP bipolar transistors.

16. The integrated circuit of claim 11, wherein the fifth transistor and seventh transistor are proximate with each other.

17. An integrated circuit comprising:
a first transistor having a control terminal coupled to a first input node, a first current terminal coupled to a second input terminal and having a second current terminal;
a second transistor having a control terminal coupled to the first input node, a first current terminal coupled to the second input terminal and having a second current terminal;
a third transistor having a control terminal and a first current terminal coupled to the second current terminal of the first transistor, and the third transistor having a second current terminal coupled to a first reference potential;
a fourth transistor having a control terminal and a first current terminal coupled to the second current terminal of the second transistor, and the fourth transistor having a second current terminal coupled to a second reference potential;
a fifth transistor having a control terminal coupled to the control terminal of the third transistor, a first current terminal coupled to an output node and a second current terminal coupled to the first reference potential;
a sixth transistor having a control terminal coupled to the control terminal of the fourth transistor, a first current terminal coupled to the output node, and a second current terminal coupled to the second reference potential;
a first buffer having an input coupled to the output node and having an output;
a seventh transistor having a first current terminal coupled to the output of the buffer, and having a control terminal and a second current terminal coupled to the first reference potential; and
a first current source coupled to the control terminal to the fifth transistor and operable to provide a current that is proportional to a current provided by the buffer through the seventh transistor:
a second buffer having an input coupled to the output node and having an output;
an eighth transistor having a first current terminal coupled to the output of the buffer, and having a control terminal and a second current terminal coupled to the second reference potential; and
a second current source coupled to the control terminal of the sixth transistor and operable to provide a current that is proportional to a current provided by the buffer through the eighth transistor.

18. The integrated circuit of claim 17, wherein the first current source is a current mirror that mirrors the output current of the first buffer.

19. The integrated circuit of claim 17, wherein the second current source is a current mirror that mirrors the output current of the second buffer.

20. The integrated circuit of claim 17, wherein the first transistor, the second transistor, the third transistor, the fourth transistor, the fifth transistor, the sixth transistor, the seventh transistor, and the eighth transistor are bipolar transistors.

* * * * *